United States Patent
Muhammad et al.

(10) Patent No.: US 7,532,874 B2
(45) Date of Patent: May 12, 2009

(54) OFFSET BALANCER, METHOD OF BALANCING AN OFFSET AND A WIRELESS RECEIVER EMPLOYING THE BALANCER AND THE METHOD

(75) Inventors: Khurram Muhammad, Dallas, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 571 days.

(21) Appl. No.: 11/270,122

(22) Filed: Nov. 9, 2005

(65) Prior Publication Data

US 2007/0105522 A1   May 10, 2007

(51) Int. Cl.
*H04B 7/00* (2006.01)
*H04B 1/10* (2006.01)

(52) U.S. Cl. ............... 455/278.1; 455/296; 455/63.1

(58) Field of Classification Search .......... 455/63.1, 455/296, 209, 190.1, 280, 278.1, 114.2
See application file for complete search history.

(56) References Cited

U.S. PATENT DOCUMENTS 6,073,002 A * 6/2000 Peterson ............... 455/326
6,535,725 B2 * 3/2003 Hatcher et al. ............ 455/317
7,031,687 B2 * 4/2006 Kivekas et al. ............ 455/313
7,409,199 B2 * 8/2008 Igarashi et al. ............ 455/296
2004/0002311 A1   1/2004 Feng
2004/0087296 A1 * 5/2004 Park et al. .............. 455/285
2004/0214547 A1   10/2004 Kim
2004/0230393 A1   11/2004 Anderson
2006/0141972 A1 * 6/2006 Matsuno ................ 455/313

FOREIGN PATENT DOCUMENTS

WO   WO 98/43357       10/1998
WO   WO 2004/109941   12/2004

* cited by examiner

*Primary Examiner*—Sonny Trinh
(74) *Attorney, Agent, or Firm*—Ronald O. Neerings; Wade James Brady, III; Frederick J. Telecky, Jr.

(57) ABSTRACT

The present invention provides an offset balancer for use with a differential mixer employing a wireless reception and an offset quantifier configured to indicate an existing DC offset of the mixer corresponding to an existing second-order intercept point applicable to the wireless reception. In one embodiment, the offset balancer includes an offset adjuster coupled to the offset quantifier and configured to provide an offset adjustment to the existing DC offset based on increasing the existing second-order intercept point.

15 Claims, 3 Drawing Sheets

OFFSET BALANCER, METHOD OF BALANCING AN OFFSET AND A WIRELESS RECEIVER EMPLOYING THE BALANCER AND THE METHOD

TECHNICAL FIELD OF THE INVENTION

The present invention is directed, in general, to a communication system and, more specifically, to an offset balancer, a method of balancing an offset and a wireless receiver that employs the balancer or the method.

BACKGROUND OF THE INVENTION

Receivers employ a mixer to translate a higher input radio frequency (RF) to a lower baseband or intermediate frequency. This process is known as down-conversion when utilizing a difference frequency between the RF input signal and a local oscillator employed by the mixer for conversion. Ideally, the mixer output signal amplitude and phase are proportional only to the RF input signal amplitude and phase and independent of local oscillator characteristics. However, mixer nonlinearities produce undesirable mixing products.

A second-order nonlinearity associated with the mixer produces an undesirable intermodulation product between two RF input frequencies. Ideally, for example, two RF input signals having different frequencies that are provided to the mixer within its frequency band should not produce a cross-modulation signal since the ideal transfer characteristic of the mixer would be perfectly linear. However, non-ideal mixers have a transfer characteristic that is nonlinear to some degree corresponding to second-order and greater nonlinear terms. The second-order nonlinearity will cause a spurious cross-modulation signal to be generated from two in-band RF input signal frequencies applied to the mixer. If this spurious cross-modulation signal is too large, the performance of the mixer and the associated quality of reception are degraded.

The second-order nonlinearity of the mixer is related to mixer imbalance wherein several mixer attributes typically contribute to this imbalance. Ideally, devices used in the mixer should have identical or perfectly matched characteristics related to switching parameters or properties associated with conducting and not conducting states. Additionally, phase errors associated with multiphase mixers may also contribute to mixer imbalance, as well. That is, if two local oscillator phases employed in the mixer differ from their intended phases, mixer imbalance will typically result. Generally, each of these characteristics contributes in some degree to increasing the mixer imbalance and its corresponding second-order nonlinearity. Therefore, mismatch contributions from such a broad-based combination of characteristics essentially assures some degree of imbalance in a mixer.

Accordingly, what is needed in the art is an effective way to decrease the second-order nonlinearity of a mixer.

SUMMARY OF THE INVENTION

To address the above-discussed deficiencies of the prior art, the present invention provides an offset balancer for use with a differential mixer employing a wireless reception and an offset quantifier configured to indicate an existing DC offset of the mixer corresponding to an existing second-order intercept point applicable to the wireless reception. In one embodiment, the offset balancer includes an offset adjuster coupled to the offset quantifier and configured to provide an offset adjustment to the existing DC offset based on increasing the existing second-order intercept point.

In another aspect, the present invention provides a method of balancing an offset for use with a differential mixer employing a wireless reception and indicating an existing DC offset of the mixer corresponding to an existing second-order intercept point applicable to the wireless reception. In one embodiment, the method includes providing an offset adjustment to the existing DC offset based on increasing the existing second-order intercept point.

The present invention also provides, in yet another aspect, a wireless receiver that includes a low noise amplifier, which processes a wireless reception and a differential mixer coupled to the low noise amplifier. The wireless receiver also includes an offset balancer coupled to the differential mixer and having an offset quantifier that indicates an existing DC offset of the mixer corresponding to an existing second-order intercept point applicable to the wireless reception. The offset balancer also has an offset adjuster, coupled to the offset quantifier, which provides an offset adjustment to the existing DC offset based on increasing the existing second-order intercept point.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
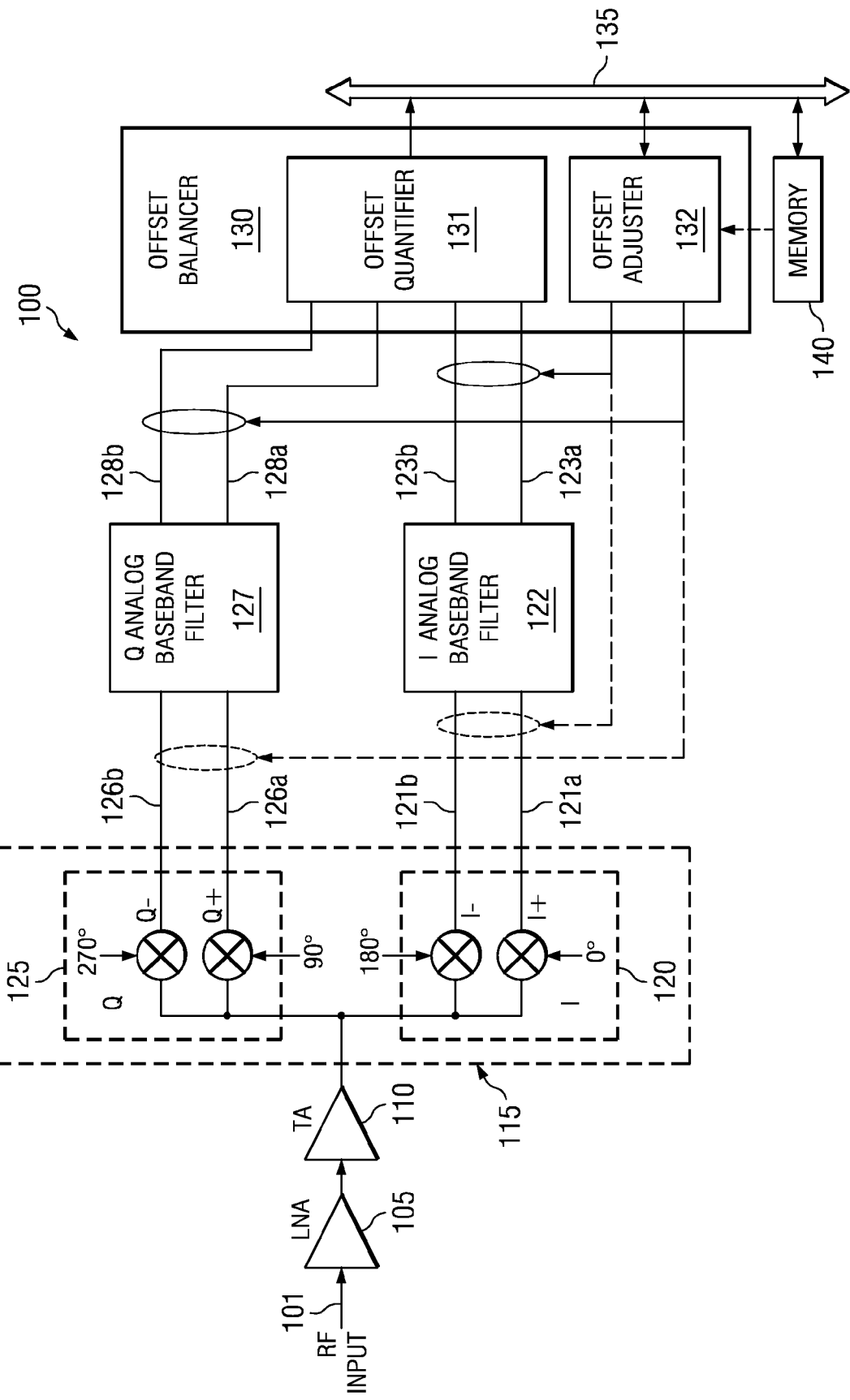
FIG. 1 illustrates a system diagram of an embodiment of a wireless receiver constructed in accordance with the principles of the present invention.

Referring initially to FIG. 1, illustrated is a system diagram of an embodiment of a wireless receiver, generally designated 100, constructed in accordance with the principles of the present invention. The wireless receiver 100 includes a low noise amplifier 105 having an RF input 101, a transconductance amplifier 110, an in-phase/quadrature-phase (I/Q) mixer 115 having an in-phase differential mixer portion 120 coupled to an in-phase analog baseband filter 122 and a quadrature differential mixer portion 125 coupled to a quadrature analog baseband filter 127. The wireless receiver 100 also includes an offset balancer 130 having an offset quantifier 131 and an offset adjuster 132 that are coupled to a digital bus 135 and a memory 140. One skilled in the pertinent art will understand that an alternative embodiment of the present invention may employ single-ended mixer portions and baseband filters, as well.

During normal operation of the wireless receiver 100, the low noise amplifier 105 is provided a receive signal at the RF input 101, which is amplified and provided to the transconductance amplifier 110. The transconductance amplifier 110 is employed to change a voltage output signal of the low noise amplifier 105 to a proportional current that is then applied to the I/Q mixer 115. The in-phase differential mixer portion 120 employs local oscillator phases of zero and 180 degrees to provide positive and negative differential in-phase outputs 121a, 121b to the in-phase analog baseband filter 122. Analogously, the quadrature-phase differential mixer portion 125 employs local oscillator phases of 90 and 270 degrees to provide positive and negative differential quadrature-phase outputs 126a, 126b to the quadrature-phase baseband filter 127.

In the illustrated embodiment, the in-phase and quadrature-phase analog baseband filters 122, 127 respectively provide positive and negative, in-phase and quadrature-phase filtered differential outputs 123a, 123b, 128a, 128b to the offset quantifier 131. During normal receiver operation, the offset quantifier 131 provides intermediate frequency amplification and digitization of the in-phase and quadrature-phase filtered differential outputs 123a, 123b, 128a, 128b wherein the digitized signals are provided to the digital bus 135 for further processing.

However, when the offset balancer 130 is employed to balance the I/Q mixer 115, the intermediate frequency amplification and digitization of the offset quantifier 131 is employed to indicate an existing DC offset of the I/Q mixer 115 that corresponds to an existing second-order intercept point IP2. Then, the offset adjuster 132, which is coupled to the offset quantifier 131, provides an offset adjustment to the existing DC offset based on increasing the existing second-order intercept point IP2. The offset adjustment is stored in the memory 140 for use by the offset adjuster 132 and is applied either to the in-phase and quadrature-phase filtered differential outputs 123a, 123b, 128a, 128b, as shown, or to the positive and negative differential in-phase and quadrature-phase outputs 121a, 121b, 126a, 126b as indicated in FIG. 1.

The second-order intercept point IP2 is generally employed to characterize an amount of second-order nonlinearity that is associated with a mixer. The second-order intercept point IP2 is proportional to the linearity of the mixer and therefore, inversely proportional to its second-order nonlinearity. Correspondingly, a greater value of the second-order intercept point IP2 indicates a lower second-order nonlinearity. An imbalance between the positive and negative outputs of a differential mixer degrades the second-order intercept point IP2 associated with the differential mixer. Therefore, imbalances in either the in-phase or quadrature-phase differential mixer portions 120, 125 degrade the performance of the I/Q mixer 115 in this regard.

Embodiments of the present invention are not attempting to force an existing DC offset to be zero, but rather, are establishing a predetermined or target value of DC offset that may be employed to increase the existing second-order intercept point IP2. This predetermined value of DC offset creates an "injected imbalance" or a "counter-imbalancing" offset between the positive and negative sides of the I/Q mixer 115, which counteracts and substantially nullifies the effect of a preexisting imbalance in the I/Q mixer 115. Therefore, this injected DC offset may be employed to provide a change in bias points of the I/Q mixer 115 such that it becomes more balanced overall. The target value of DC offset may be applied to only one of the in-phase or quadrature-phase differential mixer portions 120, 125 as appropriate to a particular application. Additionally, different predetermined values of DC offset for each of the in-phase or quadrature-phase differential mixer portions 120, 125 may be employed.

Determination of the DC offset target values may be established through a calibration process. Calibration of the I/Q mixer 115 may be accommodated employing an off-line calibration process, such as a factory calibration, wherein the calibrating agents are external to the wireless receiver 100. Alternatively, calibration of the I/Q mixer 115 may be accomplished employing an on-line calibration process wherein the calibrating agents are provided in situ to the wireless receiver 100.

In either case, two RF tones may be employed that produce an intermodulation product that falls within an appropriate frequency band. The offset adjustment to the existing DC offset is determined by reducing the intermodulation product to an acceptable level, based on existing constraints, to establish DC offset target values. These values may be directly employed by the offset adjuster 132, or other digitized values from the offset quantifier 131 may be employed that are directly proportional to the DC offset target values wherein either of these values may be stored for future use in the memory 140.

The offset adjustment to the existing DC offset established during the initial off-line calibration process may need further adjustment to maintain an established level for the second-order intercept point IP2 due to temperature effects or component drift. The on-line calibration process may employ two or more tones (from an associated transmitter, for example) to make continual or periodic offset adjustment updates and thereby maintain or improve the initially established second-order intercept point IP2. Additionally, an analog loop back test employing two or more tones, initiated either digitally or from associated transmissions, may be used to verify proper operation of the wireless receiver 100.

Figure 2:
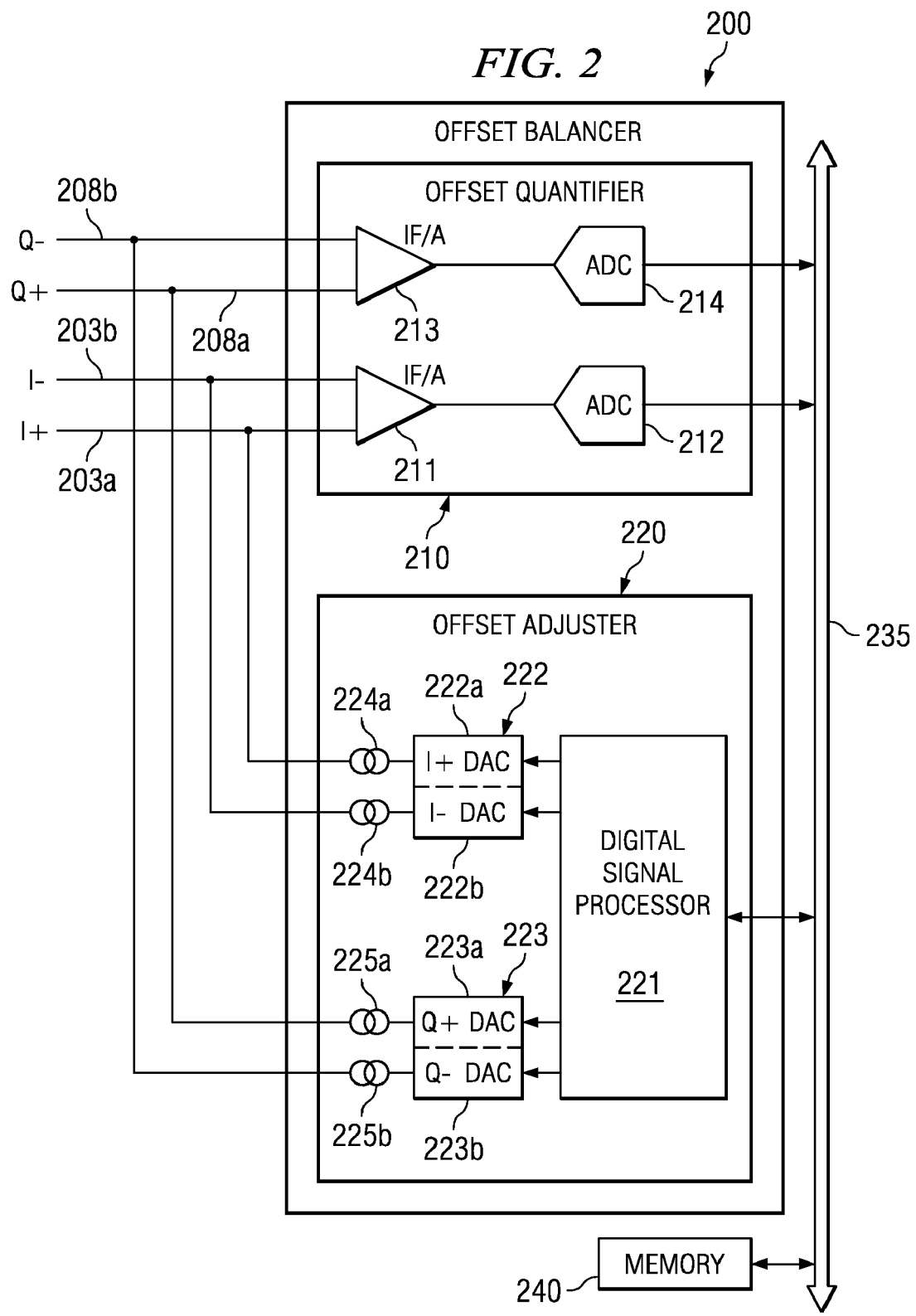
FIG. 2 illustrates a diagram of an embodiment of an offset balancer constructed in accordance with the principles of the present invention.

Turning now to FIG. 2, illustrated is a diagram of an embodiment of an offset balancer, generally designated 200, constructed in accordance with the principles of the present invention. The offset balancer 200 includes an offset quantifier 210 and an offset adjuster 220. The offset quantifier 210 includes an in-phase intermediate frequency (IF) amplifier 211 coupled to an in-phase analog to digital converter (ADC) 212 and a quadrature-phase IF amplifier 213 coupled to a quadrature ADC 214 wherein both the in-phase and the quadrature-phase ADCs 212, 214, are further coupled to a digital bus 235 and a memory 240.

The offset adjuster 220 includes a digital signal processor (DSP) 221 coupled to the digital bus 235 and the memory 240, an in-phase digital to analog converter (DAC) group 222 and a quadrature-phase DAC group 223 coupled to the DSP 221. The offset adjuster 220 also includes in-phase positive and negative current sources 224a, 224b, and quadrature-phase positive and negative current sources 225a, 225b coupled to the in-phase and quadrature-phase DAC groups 222, 223, as shown.

The offset quantifier 210 is coupled to in-phase and quadrature-phase outputs associated with a differential I/Q mixer employing positive and negative in-phase differential outputs 203a, 203b and positive and negative quadrature-phase differential outputs 208a, 208b. As discussed with respect to FIG. 1 regarding the normal operation of a receiver, the offset quantifier 210 conditions and digitizes the differential in-phase and quadrature-phase mixer signals derived from a receive signal. This is accomplished with the in-phase IF amplifier 211 and ADC 212 and the quadrature-phase IF amplifier 213 and ADC 214.

The offset adjuster 220 employs DC offset target values created by using appropriate offset adjustments to preexisting DC offsets, which were determined during a previous calibration phase and stored in the memory 240. In the illustrated embodiment, the DSP 221 receives four stored digital DC offset target values from the memory 240 and respectively provides an appropriate one to the in-phase or quadrature-phase positive or negative DC offset DACs 222a, 222b, 223a, 223b. In-phase and quadrature-phase positive and negative current sources 224a, 224b, 225a, 225b convert the analog voltage outputs from each of the DC offset DACs 222a, 222b, 223a, 223b to corresponding currents for application to respective positive and negative in-phase and quadrature-phase differential outputs 203a, 203b, 208a, 208b, as shown.

In the illustrated embodiment of FIG. 2, current sources are employed to provide the offsets, which would correspond to employing an upstream transconductance amplifier as was shown in FIG. 1. In an alternative embodiment, voltage sources may be employed to provide the offsets as appropriate to a particular application.

Each of the positive and negative in-phase and quadrature-phase differential outputs 203a, 203b, 208a, 208b provide a separate DC offset target value thereby allowing independent adjustment of their offsets. In-phase and quadrature-phase applied differential offsets for each of the in-phase and quadrature-phase differential output pairs 203a, 203b and 208a, 208b may be determined as the algebraic difference between the respective separately provided in-phase and quadrature-phase DC offset target values. Therefore, the size and polarity of each of the in-phase and quadrature-phase applied differential offsets are adjusted by the offset balancer 200 to provide as much increase in the second-order intercept point IP2 of the mixer as allowed by other constraining circumstances.

Figure 3:
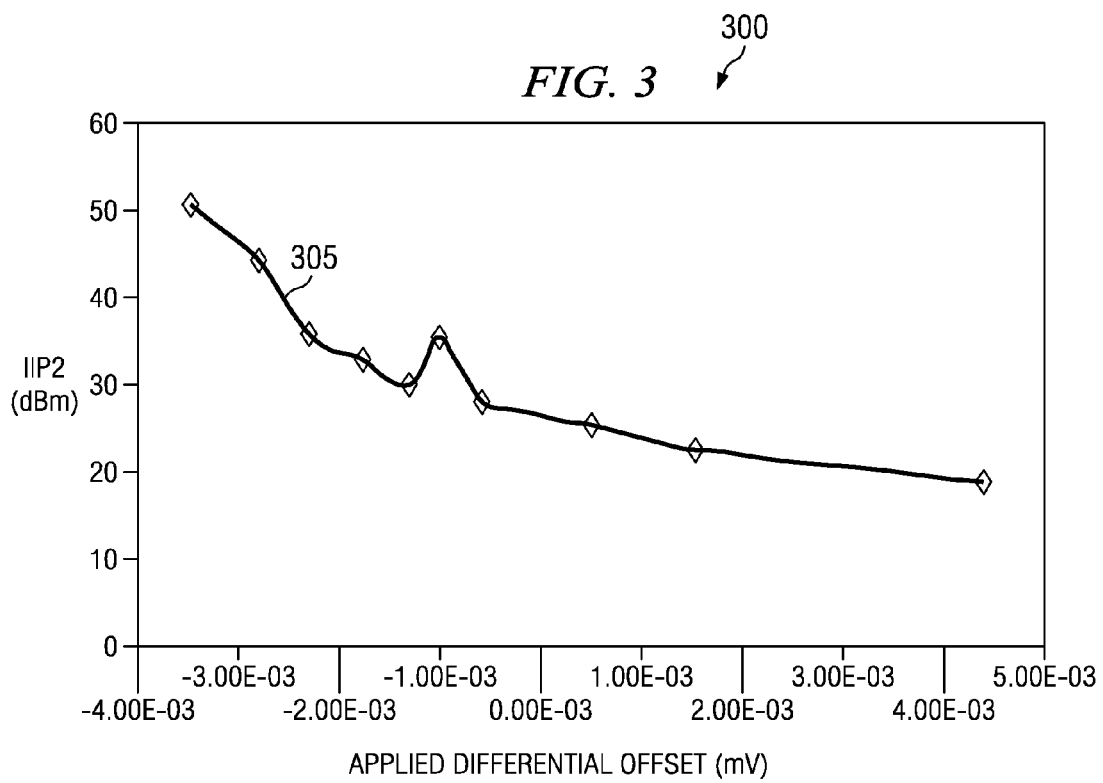
FIG. 3 illustrates a chart of an embodiment of a second-order intercept point IP2 response showing how mixer IP2 is impacted by DC offset adjustment.

Turning now to FIG. 3, illustrated is a chart of an embodiment of a second-order intercept point IP2 response, generally designated 300, showing how mixer IP2 is impacted by DC offset adjustment. The chart 300 includes an IP2 response curve 305 associated with a differential mixer. In the illustrated embodiment, the IP2 response curve 305 represents a second-order intercept point IP2 response that has been referred to the input of the differential mixer, which is designated as IIP2 in the chart 300. The IP2 response curve 305 shows how the second-order intercept point IP2 varies as a function of applied differential offset. An equivalent increase in the second-order intercept point IP2 of about 30 dBm may be observed as the applied differential offset varies from about a positive 4.5 millivolts to about a negative 3.5 millivolts.

Figure 4:
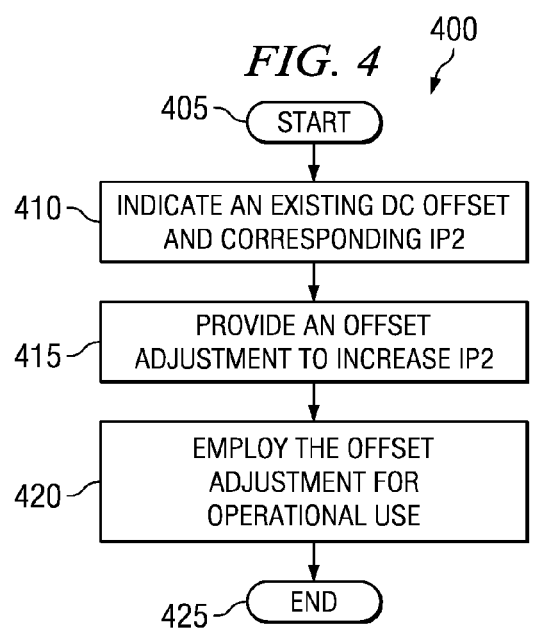
FIG. 4 illustrates a flow diagram of an embodiment of a method of balancing an offset carried out in accordance with the principles of the present invention.

Turning now to FIG. 4, illustrated is a flow diagram of an embodiment of a method of balancing an offset, generally designated 400, carried out in accordance with the principles of the present invention. The method 400 is for use with a differential mixer employing a wireless reception and starts in a step 405. Then, in a step 410, an existing DC offset of the mixer is indicated corresponding to an existing second-order intercept point IP2 applicable to the wireless reception. An offset adjustment is provided to the existing DC offset based on increasing the existing second-order intercept point IP2, in a step 415. The offset adjustment is determined in either an off-line or an on-line calibration process and then stored in a memory. Alternatively, a quantity directly proportional to the offset adjustment may be stored in the memory.

The offset adjustment is employed for operational use with the differential mixer in a step 420. In the illustrated embodiment, the offset adjustment provides a differential offset adjustment wherein at least one of an in-phase adjustment or a quadrature-phase adjustment is applied to the mixer, in the step 420. Additionally, the offset adjustment may be provided to a direct output or a conditioned output of the mixer employing either a current-based or a voltage-based offset adjustment. The method 400 ends in a step 425.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing an offset balancer, a method of balancing an offset and a wireless receiver employing the balancer or the method have been presented. Advantages include increasing the second-order intercept point IP2 of a differential mixer by applying a targeted value of DC offset to the output of the mixer thereby enhancing the performance of the mixer. This corresponds to establishing a predetermined value of DC offset that creates an injected imbalance or a counter-imbalancing offset between the positive and negative sides of the differential mixer.

The predetermined value of DC offset counteracts and substantially nullifies a preexisting imbalance of the mixer that allowed a lower value of the second-order intercept point IP2 to exist. This injected DC offset may be employed to provide a change in bias points of the mixer such that it becomes more balanced overall. By injecting a predetermined offset value, it should be understood that embodiments of the present invention are not attempting to force an existing DC offset to be zero but, rather, to adjust the mixer offset to a value that better balances the positive and negative outputs of the mixer.

Although the present invention has been described in detail, those skilled in the art should understand that they can make various changes, substitutions and alterations herein without departing from the spirit and scope of the invention in its broadest form.

What is claimed is:

1. An offset balancer, for use with a differential mixer employing a wireless reception and having an offset quantifier configured to indicate an existing DC offset of said mixer corresponding to an existing second-order intercept point applicable to said wireless reception, comprising:
    an offset adjuster coupled to said offset quantifier and configured to provide an offset adjustment to said existing DC offset based on increasing said existing second-order intercept point, wherein said offset adjustment provides a differential offset adjustment and wherein said differential offset adjustment provides at least one of an in-phase adjustment and a quadrature-phase adjustment.

2. The balancer as recited in claim 1 wherein said offset adjustment is provided to an output of said mixer.

3. The balancer as recited in claim 1 wherein an off-line calibration process determines a value of said offset adjustment.

4. The balancer as recited in claim 1 wherein an on-line calibration process determines an updated value of said offset adjustment.

5. The balancer as recited in claim 1 wherein said offset adjustment is stored in a memory.

6. A method of balancing an offset, for use with a differential mixer employing a wireless reception and indicating an existing DC offset of said mixer corresponding to an existing second-order intercept point applicable to said wireless reception, comprising:

provision of an offset adjustment to said existing DC offset based on increasing said existing second-order intercept point, wherein said offset adjustment provides a differential offset adjustment and wherein said differential offset adjustment provides at least one of an in-phase and a quadrature-phase adjustment.

7. The method as recited in claim 6 wherein said offset adjustment is provided to an output of said mixer.

8. The method as recited in claim 6 wherein an off-line calibration process determines a value of said offset adjustment.

9. The method as recited in claim 6 wherein an on-line calibration process determines an updated value of said offset adjustment.

10. The method as recited in claim 6 wherein said offset adjustment is stored in a memory.

11. A wireless receiver, comprising:

a low noise amplifier that processes a wireless reception;

a differential mixer coupled to said low noise amplifier; and an offset balancer coupled to said differential mixer and having an offset quantifier that indicates an existing DC offset of said mixer corresponding to an existing second-order intercept point applicable to said wireless reception, including:

an offset adjuster, coupled to said offset quantifier, that provides an offset adjustment to said existing DC offset based on increasing said existing second-order intercept point, wherein said offset adjustment provides a differential offset adjustment and wherein said differential offset adjustment provides at least one of an in-phase adjustment and a quadrature-phase adjustment.

12. The receiver as recited in claim 11 wherein said offset adjustment is provided to an output of said mixer.

13. The receiver as recited in claim 11 wherein an off-line calibration process determines a value of said offset adjustment.

14. The receiver as recited in claim 11 wherein an on-line calibration process determines an updated value of said offset adjustment.

15. The receiver as recited in claim 11 wherein said offset adjustment is stored in a memory.

* * * * *